(12) United States Patent
Hashimoto

(10) Patent No.: US 6,297,964 B1
(45) Date of Patent: Oct. 2, 2001

(54) SEMICONDUCTOR DEVICE, METHOD OF FABRICATING THE SAME FILM CARRIER TAPE, CIRCUIT BOARD, AND ELECTRONIC APPARATUS

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/204,548

(22) Filed: Dec. 3, 1998

(30) Foreign Application Priority Data

Dec. 8, 1997 (JP) .................................................. 9-354180

(51) Int. Cl.⁷ .................................................. H05K 01/18
(52) U.S. Cl. .......................... 361/760; 361/748; 361/750; 361/751; 361/813; 174/254; 174/255; 174/260; 174/261; 257/701; 257/690; 257/673; 438/110; 438/112
(58) Field of Search .................................. 361/760, 748, 361/749, 750, 757, 728, 813; 257/701, 690, 707, 706, 724, 668, 673; 174/254, 255, 256, 260, 261; 438/110, 112, 113, 122

(56) References Cited

U.S. PATENT DOCUMENTS

| | | | | |
|---|---|---|---|---|
| 4,949,155 | * | 8/1990 | Tajima et al. | 174/255 |
| 5,036,380 | * | 7/1991 | Chase | 257/668 |
| 5,083,191 | * | 1/1992 | Ueda | 257/783 |
| 5,177,596 | * | 1/1993 | Muramatsu et al. | 174/254 |
| 5,355,018 | * | 10/1994 | Fierkens | 257/669 |
| 5,400,219 | * | 3/1995 | Teele et al. | 361/760 |
| 5,448,451 | * | 9/1995 | Takubo et al. | 361/749 |
| 5,453,913 | * | 9/1995 | Koyanagi | 361/813 |
| 5,545,922 | * | 8/1996 | Golwalkar et al. | 257/676 |
| 5,786,631 | | 7/1998 | Fishley et al. | 257/701 |
| 5,804,872 | * | 9/1998 | Miyano et al. | 257/668 |
| 5,811,877 | * | 9/1998 | Miyano et al. | 257/706 |
| 5,878,485 | * | 3/1999 | Wood et al. | 29/825 |

FOREIGN PATENT DOCUMENTS

| | | |
|---|---|---|
| A-8-31869 | 2/1996 | (JP) . |
| A-8153826 | 6/1996 | (JP) . |
| A-8274214 | 10/1996 | (JP) . |
| A-9008186 | 1/1997 | (JP) . |
| A2-9167812 | 6/1997 | (JP) . |

\* cited by examiner

Primary Examiner—Jeffrey Gaffin
Assistant Examiner—David Foster
(74) Attorney, Agent, or Firm—Oliff & Berridge, PLC

(57) ABSTRACT

A semiconductor device comprising an insulating film having a device hole, a plurality of bumps formed on the insulating film, a plurality of first leads having end faces thereof exposed on an outline edge of the insulating film, each of the first leads being electroplated and connected with one of the bumps, a plurality of second leads having end portions thereof protruding into the device hole, each of the second leads being electroplated and connected with one of the bumps, and a semiconductor chip connected with the end portions of the second leads in the device hole. The insulating film is outlined to have a cut in a region including each of the exposed end faces of the first leads.

16 Claims, 6 Drawing Sheets

SEMICONDUCTOR DEVICE, METHOD OF FABRICATING THE SAME FILM CARRIER TAPE, CIRCUIT BOARD, AND ELECTRONIC APPARATUS

BACKGROUND OF THE INVENTION

1. Field of the Invention

The present invention relates to a semiconductor device, a method of fabricating the same, a film carrier tape, a circuit board, and an electronic apparatus.

2. Description of Related Art

In the pursuit of microminiaturization of semiconductor devices, a bare chip mounting arrangement is regarded as an ideal form of assembling. However, since quality assurance of a bare chip and the handling thereof are practically difficult, it in assembled in a package in semiconductor device fabrication. As one of package forms meeting multi-terminal requirements, a ball grid array (BGA) type of package has been developed recently. On a substrate of the BGA type package, external terminal bumps are arranged in an area array to permit surface mounting.

A flexible package substrate is used in one kind of BGA type package. In fabrication of such a kind of BGA type package, a tape automated bonding (TAB) technique is practiced since it satisfies a need for mounting a semiconductor chip having arrow-pitch pads and allows a continuous flow of production.

In Japanese Patent Application Laid-Open No. 8-31869, for example, there is disclosed a method of fabricating a BGA type package using a film carrier tape. On the film carrier tape, individual leads are formed for each package, i.e., not all the leads are formed to have conductivity. It is therefore necessary to provide electroplating on individual leads for each package, resulting in a burdensome step in fabrication. Even if all the leads are formed to have conductivity on the film carrier tape, the end face of each lead is exposed after the film carrier tape is punched out, making it necessary to take any special measures for preventing leakage on insulation, degradation of moisture resistance reliability, etc.

SUMMARY OF THE INVENTION

The present invention obviates the abovementioned disadvantages, and an object thereof is to provide a semiconductor device which can prevent degradation of reliability even if the end face of a lead is exposed on the outline edge of a film, a method of its fabrication, a film carrier tape, a circuit board and electronic apparatus.

(1) According to a first aspect of the present invention. there is provided a semiconductor device comprising:

an insulating film having a device hole;

a plurality of external electrodes formed on the insulating film;

a plurality of first leads having end faces exposed on an outline edge of the insulating film, each of the first leads being electroplated and connected with one of the external electrodes, and the insulating film being outlined to have a cut in a region including each of the exposed end faces of the first leads;

a plurality of second leads having end portions protruding into the device hole, each of the second leads being electroplated and connected with one of the external electrodes; and a semiconductor element connected with the end portions of the second leads in the device hole.

In the semiconductor device of the first aspect of the present invention, surface mounting can be made using the plural external electrodes formed on the insulating film. The leads are electroplated. Although the end faces of the first leads are exposed on an outline edge of the insulating film, the insulating film is outlined to have a cut in a region including each of the exposed end faces of the first leads. Therefore, even if the outside edges of the insulating film are held with fingers, the end faces of the first leads do not come into contact with fingers, thus preventing degradation of moisture resistance reliability due to accidental intrusion of moisture into the inside part.

(2) The first leads may be formed so that the exposed end faces are gathered at a plurality of points.

Since the first leads are disposed to circumvent the external electrodes, the first leads are formed closely on predetermined regions in most cases. Where the exposed end faces of the first leads are gathered at certain points, the insulating film can be cut at respective regions corresponding to the gathering of the end faces of the first leads. Thus, the number of cuts can be reduced.

(3) According to a second aspect of the present invention. there is provided a semiconductor device comprising:

an insulating film having a device hole;

a plurality of external electrodes formed on the insulating film;

a plurality of first leads having end faces exposed on an outline edge of the insulating film, each of the first leads being electroplated and connected with one of the external electrodes, and the first leads being formed so that at least the exposed end faces are arranged in a mutually dispersed fashion;

a plurality of second leads having end portions protruding into the device hole, each of the second leads being electroplated and connected with one of the external electrodes; and a semiconductor element connected with the end portions of the second leads in the device hole.

In the semiconductor device of the second aspect of the present invention. Surface mounting can be made using the plural external electrodes formed on the insulating film. The leads are electroplated. Although the end faces of the first leads are exposed on the outline edge of the insulating film, the exposed end faces are arranged in a mutually dispersed fashion. Therefore, since adjacent end faces are spaced widely, an electric field between them can be reduced. Reduction of the electric field makes leakage unapt to occur even if moisture adheres to the outline edge of the insulating film thereby improving reliability of the semiconductor device.

(4) The first leads may be arranged with approximately equal spacing.

In this way, the exposed end faces of the first leads can be arranged in mutually dispersed relationship.

(5) According to a third aspect of the present invention, there is provided a method of making a semiconductor device, comprising steps of:

providing a film carrier tape having, a plurality of device holes, a plurality of external electrodes, a plurality of leads having the end portions protruding into the device hole, each of the leads running through one of the external electrodes, a plating lead connected with all the leads, the leads being electroplated via the plating lead, and a semiconductor element located in each of the device holes and connected with ones of the end portions of the leads; and stamping out from the film carrier tape a shape having a cut in a region in which the leads are formed.

In this aspect of the present invention, each semiconductor element is mounted on the film carrier tape having the external electrodes and leads, and then the film carrier tape is punched out for semiconductor device fabrication. At this process of semiconductor device fabrication, the film carrier tape is punched out so that it is configured to have a cut in a lead-formed region. A semiconductor device thus fabricated has a cut in a region including each of the exposed end faces of the leads. Therefore, even if the semiconductor device is held with fingers, the end faces of the leads do not come into contact with fingers, thus preventing degradation of moisture resistance reliability due to accidental intrusion of moisture into the inside part.

(6) The leads may be formed to gather at a plurality of points.

Since the leads are disposed to circumvent the external electrodes, the loads are formed closely on predetermined regions in most cases. The number of cuts can be reduced in such a manner that the insulating film is cut at regions corresponding to the gathering of the leads (7) According to a fourth aspect of the present invention, there is provided a film carrier tape comprising:

portions defining a plurality of device holes;

a plurality of external electrodes;

a plurality of leads having end portions protruding into the device holes, each of these leads running through one of the external electrodes; and a plating lead connected with all the leads;

wherein the leads are electroplated via the plating leads; and are formed to be arranged in a mutually dispersed fashion in a region between the external electrodes and the plating lead.

Since all the leads are connected with the plating lead, they are electroplated via the plating lead. On the film carrier tape, the leads are arranged in a mutually dispersed fashion in a region between the external electrodes and the plating lead. Therefore, when the film carrier tape is punched out, exposed end faces of the leads are arranged in mutually dispersed relationship. Since the end faces of adjacent leads are spaced widely, an electric field between them can be reduced. Reduction of the electric field makes leakage unapt to occur even if moisture adheres to the outline edge of the insulating film, thereby making it possible to attain a semiconductor device having higher reliability.

(8) The leads may be arranged with approximately equal spacing.

In this way, the exposed end faces of the leads can be arranged in mutually dispersed relationship.

(9) According to a fifth aspect of the present invention, there is provided a circuit board on which is mounted the aforementioned semiconductor device.

(10) According to a sixth aspect of the present invention, there is provided an electronic apparatus including the aforementioned circuit board.

The above and other objects, features and advantages of the present invention will become more apparent from the following description of embodiments with reference to the accompanying drawings.

DETAILED DESCRIPTION OF THE EMBODIMENTS

Figure 6:
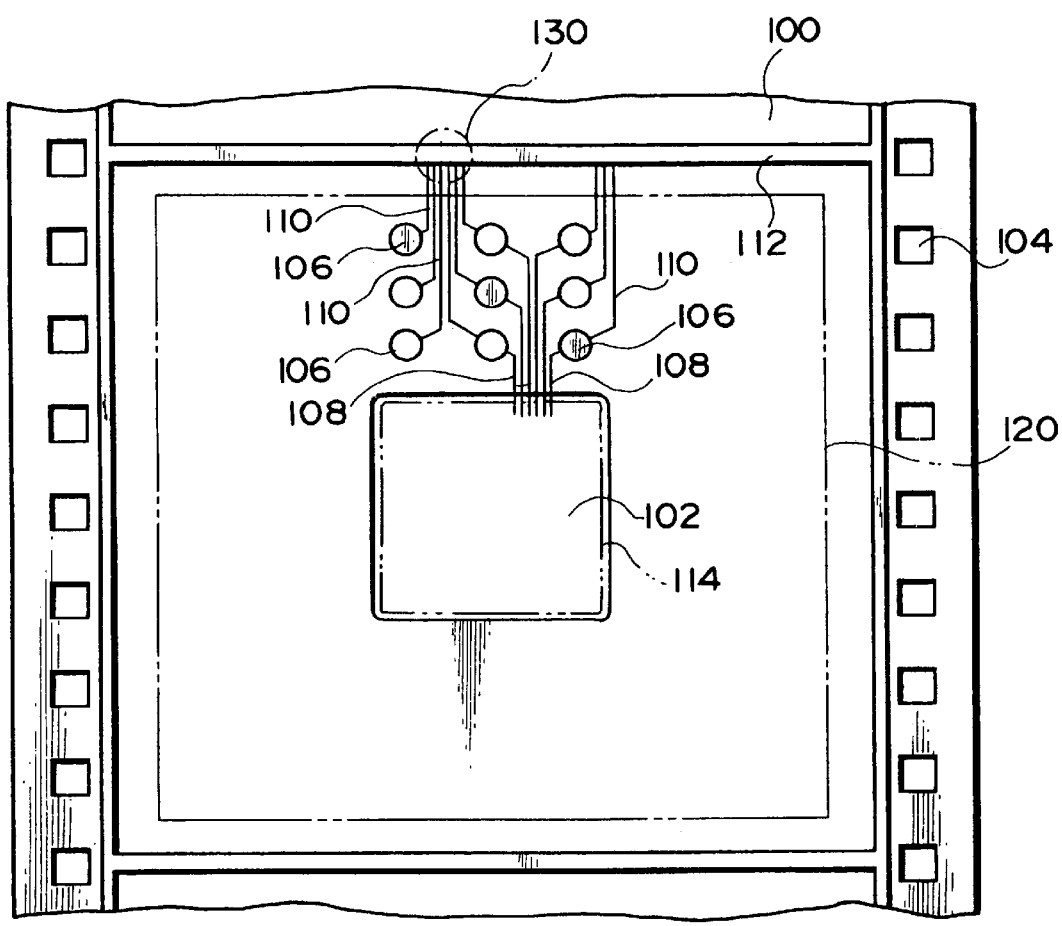
FIG. 6 is a schematic diagram showing a film carrier tape examined for the present invention.

The conventional art examined for the present invention will now be described before proceeding to detailed description of the embodiments of the present invention. Referring to FIG. 6, there is shown a schematic diagram indicating a film carrier tape examined by the inventors. As shown in this figure, a device hole 202 and sprocket holes 104 are formed on a film 100 made of resin in a tape shape. On the film 100, copper foil is etched to form a land 106, leads 108 and 110, and a plating lead 112, The land 106 is a region where a bump (not shown) is provided. The lead 108 has one end portion thereof protruding into the device hole 102 and the other end portion thereof connected with the land 106. In the inside of the device hole 102, the end portion of the lead 108 is bonded to an electrode (not shown) of a semiconductor chip 114. The lead 110 provides connection between the land 106 and the plating lead 112.

Since each land 106, leads 108 and 110 have conductivity via the plating lead 112, it is possible to perform electroplating on them. In other words, for carrying out electroplating, it is required to form them in conducting relationship.

After the semiconductor chip 114 is mounted, the film 100 is punched out into a shape indicated by a dot-dot-dash line 120.

On a semiconductor device thus fabricated, the end face of the lead 110 is exposed on the outline edge of the punched-out film 100. Hence, if the exposed end face of the lead 110 is held with fingers, it may result in sweat or moisture on fingers intruding inside through corrosion of the lead 110, thus causing degradation of moisture resistance reliability.

Still more, as shown in FIG. 6, in a region 130 where a plurality of 110 are gathered, an electric field becomes intense since the leads 110 are disposed closely. Hence, if moisture adheres to the exposed end face of lead 110, leakage is prone to occur.

The present invention is intended to solve these disadvantages in the art mentioned above. The following describes the present invention in detail by way of example with reference to the accompanying drawings.

First Embodiment

Figure 1:
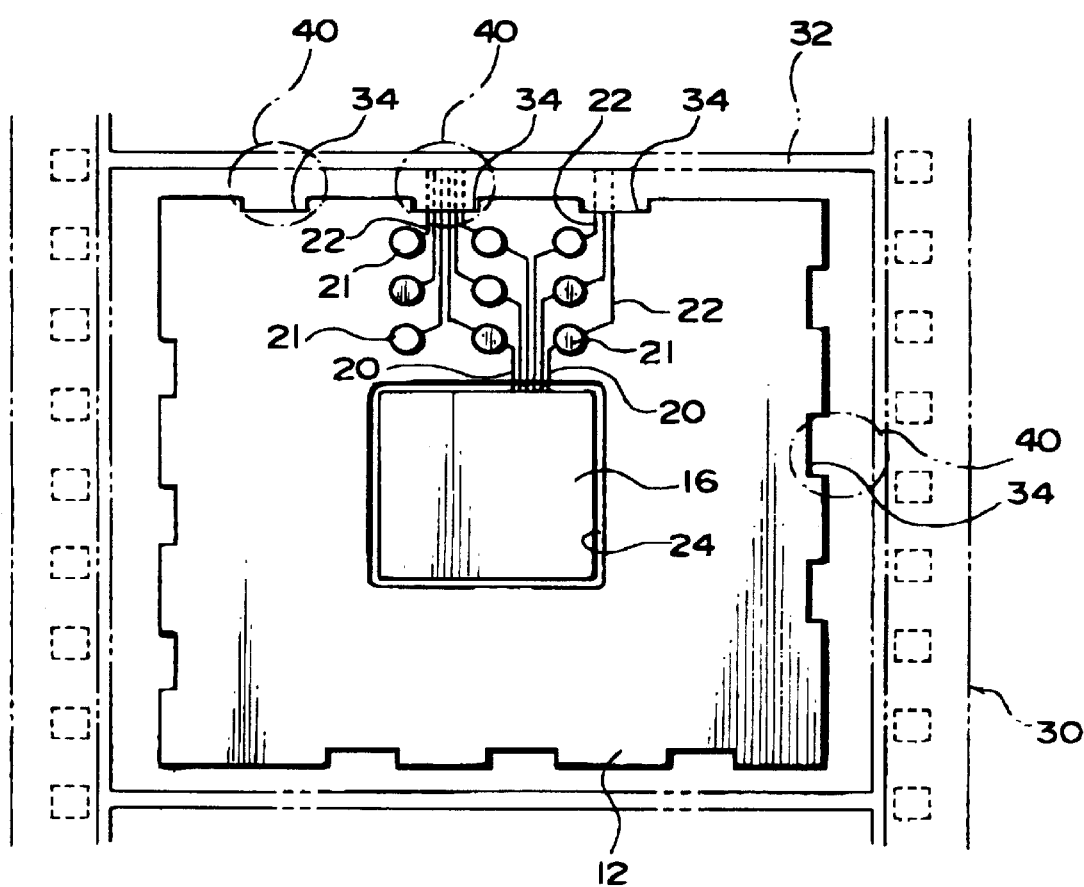
FIG. 1 is a diagram showing a semiconductor device fabrication process according to the first embodiment of the present invention.
Figure 2:
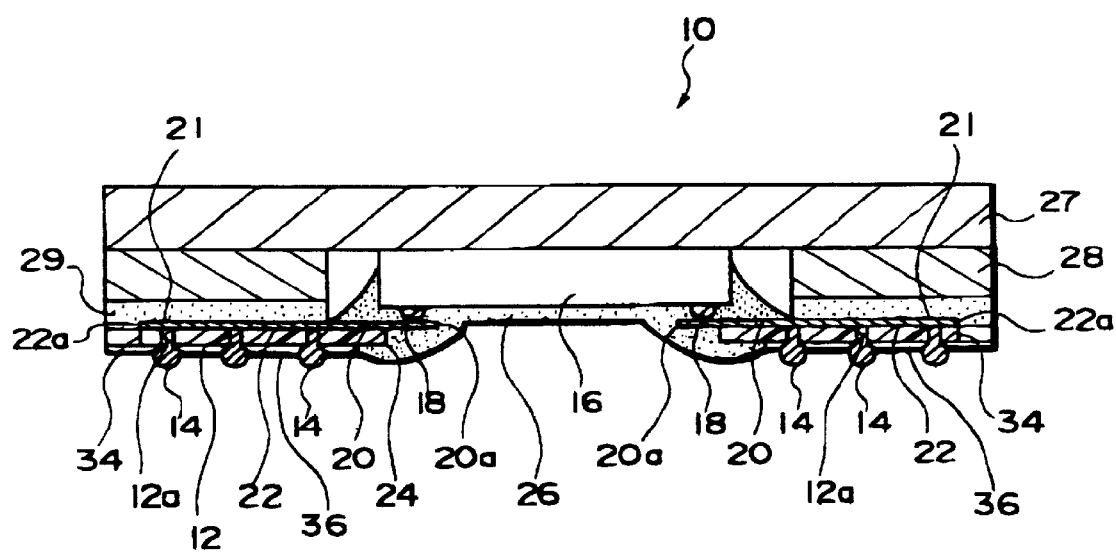
FIG. 2 is a diagram showing a finished semiconductor device according to the first embodiment.

FIG. 1 is an explanatory diagram concerning a semiconductor device fabrication process in the first embodiment of the present invention, and FIG. 2 shows a finished semiconductor device according to the first embodiment.

Referring to FIG. 2, there is shown across-sectional view of a semiconductor device 10 assembled in a BGA package. As shown in this figure, the semiconductor device 10 comprises an insulating film 12, a plurality of bumps 14 formed on the insulating film 12, and a semiconductor chip, With the plural bumps 14 surface mounting can be implemented.

Referring to FIG. 1, there is shown a long film carrier tape 30, which is punched out to provide the insulating film 12. The size of the insulating film 12 is larger than that of the semiconductor chip 16. The film carrier tape 30 is made of such a material as polyimide resin, on the insulating film 12, a device hole 24 is formed, and there are arranged a plurality of leads 20 and 22 and a plurality of lands 21 outside the device hole 24.

More specifically, the film carrier tape 30 has a plurality of device holes 24 pre-formed, and a plurality of leads 20 and 22 and a plurality of lands 21 are arranged outside each device hole 24. These leads 20 and 22 (second and first leads) and lands 21 are electroplated. The insulating film 12 is attained by punching out the film carrier tape 30.

Through an opening 12a in the insulating film, each bump 14 is formed so that it protrudes from the side opposite to the second and first leads 20 and 22 and the lands 21. Thus, on the side where each bump 14 is formed, the second and first leads 20 and 22 and the lands 21 are not exposed. Each bump 14 is made of such a material as solder, for example, and the tip end thereof has a ball-like shape. There may be provided such an arrangement that each bump 14 is integrally formed of solder to the inside of the opening 12a or that any conductive material other than solder is provided in the inside of the opening 12a and the tip end of each bump 14 made of solder is formed on it. As a material of the bump 14, copper or the like may be used in lieu of solder.

One end portion 20a of the second lead 20 protrudes into the device hole 24, and the end portion 20a is connected with an electrode 18 of the semiconductor chip 16. More particularly, on the side of the insulating film 12 where the second lead 20 is formed, the semiconductor chip 16 is disposed so that the electrode 18 thereof is positioned in the inside of the device hole 24, and the end portion 20a of the second lead 20 is bonded to the electrode 18.

The second lead 20 provides connection between the electrode 18 of the semiconductor chip 16 and the land 21. The land 21 is connected to a plating lead 32 (see FIG. 1) through the first lead 22. All the first leads 22 are connected with the plating lead 32, and these first leads 22 are disposed to circumvent the lands 21. As shown in FIG. 1, therefore, a plurality of first leads 22 are gathered at a joint part 40 connected with the plating lead 32. The plating lead 32 is used to electroplate the second and first leads 20 and 22 and the lands 21.

One of features of the present embodiment consists in the outline of the insulating film 12 which is punched out of the film carrier tape 30. More specifically, the insulating film 12 is outlined to have a cut 34. The cut 34 is an indented part on the rectangular periphery of the insulating film 12, and the cut 34 is disposed in a region where the first leads 22 are formed. In the present embodiment, the plural first leads 22 are gathered at the joint part 40, where the cut 34 is formed.

Since the cut 34 is formed as mentioned above, an end face 22a of the first lead 22 is positioned inside the periphery of the semiconductor device 10. Therefore, when the semiconductor device 10 is held with fingers, the end face 22a of the first lead 22 does not come into contact with fingers. Since sweat or moisture on fingers is not liable to adhere to the end face 22a, it is possible to prevent accidental intrusion of moisture into the inside, thereby improving reliability of the semiconductor device 10.

Still more, in the present embodiment, a plate 28 can be provided on the insulating film 12 on the side opposite to the bump 14. The plate 28 is made of copper, stainless steel, copper alloy or the like, and it has strength capable of maintaining a planar configuration. The plate 28 is attached to the second and first leads 20 and 22 and the lands 21 by means of insulating adhesive 29. Circumventing the semiconductor chip 16, the plate 28 is attached to the entire surface of one side of the insulating film. In this fashion, the second and first leads 20 and 22 and the lands 21 are covered with the insulating adhesive 29 and the plate 28 for protection. The insulating adhesive 29, in particular, serves as a protective layer similar to solder resist. The insulating adhesive 29 may be prepared in a form of thermosetting or thermoplastic film and pre-attached to the plate 28. Thus, the plate 28 can be thermo compression-bonded to the side of the insulating film 12 on which the second and first leads 20 and 22 and the lands 21 are formed.

In a potting process with epoxy resin 26, interstices between the semiconductor chip 16 and the insulating film 12 are sealed. The epoxy resin 26 is also applied to the device hole 24 and the periphery of the semiconductor chip 16.

Still more, in the present embodiment, a plate 28 is provided on the insulating film 12 on the side opposite to the bump 14. The plate 28 is made of copper, stainless steel, copper alloy or the like, and it has strength capable of maintaining a planar configuration. The plate 28 is attached to the leads 20 and 22 and the lands 21 by means of insulating adhesive 29. Circumventing the semiconductor chip 16, the plate 28 is attached to the entire surface of one side of the insulating film. In this fashion, the leads 20 and 22 and the lands 21 are covered with the insulating adhesive 29 and the plate 28 for protection. The insulating adhesive 29, in particular, serves as a protective layer similar to solder resist The insulating adhesive 29 may be prepared in a form of thermosetting or thermoplastic film and pre-attached to the plate 28. Thus, the plate 28 can be thermo compression-bonded to the side of the insulating film 12 on which the leads 20 and 22 and the lands 21 are formed.

Provision of the plate 28 also prevents the insulating film 12 from being distorted or warped. This ensures uniformity in height of the bumps 14 to improve planarity thereof, leading to enhancement in yield of mounting on circuit boards.

The plate 28 may be attached via the insulating adhesive 29 after resist is provided on the second and first leads 20 and 22 and the lands 21. In this manner, it becomes possible to prevent inclusion of impurities when the plate 28 is attached.

On the side opposite to the mounting side of the semiconductor chip 16, a heat radiating plate 27 is bonded via thermally conductive adhesive such as silver paste. Thus, heat dissipation from the semiconductor chip 16 can be made efficiently. Larger in size than the semiconductor chip 16, the heat radiating plate 27 can be bonded to the plate 28.

Adhesive is provided between the plate 28 and the heat radiating plate 27, though not shown in FIG. 2, and the plate 28 and the heat radiating plate 27 are bonded together via the adhesive. The heat radiating plate 27 and the semiconductor chip 16 may be bonded via the same adhesive.

As shown in FIG. 2, in the present embodiment, solder resist 36 is applied to the side of the insulating film 12 on which the bumps 14 are provided. The solder resist 36 may be omitted, however. In case that the second and first leads 20 and 22 are formed on the bump 14 side, it is required to apply the solder resist 36 to cover these second and first leads 20 and 22.

The following describes a method of semiconductor device fabrication in connection with the embodiment mentioned above.

First, the film carrier tape 30 shown in FIG. 1 is prepared. Its preparation process is briefed below: On a long film, the device holes 24 and the openings 12a (shown in FIG. 2) are formed, and copper foil is attached to it. By means of etching, the second and first leads 20 and 22, the lands 21, and the plating lead 32 are formed. Then, using the plating lead 32, the second and first leads 20 and 22 and the lands 21 are electroplated. Since other steps of the process are already known, description of them is not given herein.

Then, the following processes are carried out: The end portion 20a of the second lead 20 is bonded to the electrode 18 of the semiconductor chip 16, the plate 28 can be attached to the insulating film 12 (film carrier tape 30), the epoxy resin 26 is provided in interstices between the semiconductor chip 16 and the insulating film 12 (film carrier tape 30), the film carrier tape 30 is punched out into a shape of the insulating film 12, and the heat radiating plate 27 is bonded to the semiconductor chip 16. The sequence of these processes may be altered.

When the film carrier tape 30 is punched out, the cut 34 is formed so that the end face 22a (shown in FIG. 2) of the first lead 22 between the plating lead 32 and the land 21 is located at an indented part of the cut 34. In the present embodiment, since the plural first leads 22 are gathered at the predetermined regions 40 as shown in FIG. 1, the cut 34 is formed in the regions 40.

Through these processes, the semiconductor device 10 mentioned above can be attained. According to the present embodiment, the end face 22a of the first lead 22 is located at an indented part of the cut 34. Therefore, when the semiconductor device 10 is held with fingers, the end face 22a of the first lead 22 does not come into contact with fingers, thus preventing degradation of moisture resistance reliability due to accidental intrusion of moisture into the inside of the semiconductor device 10.

Second Embodiment

Figure 3:
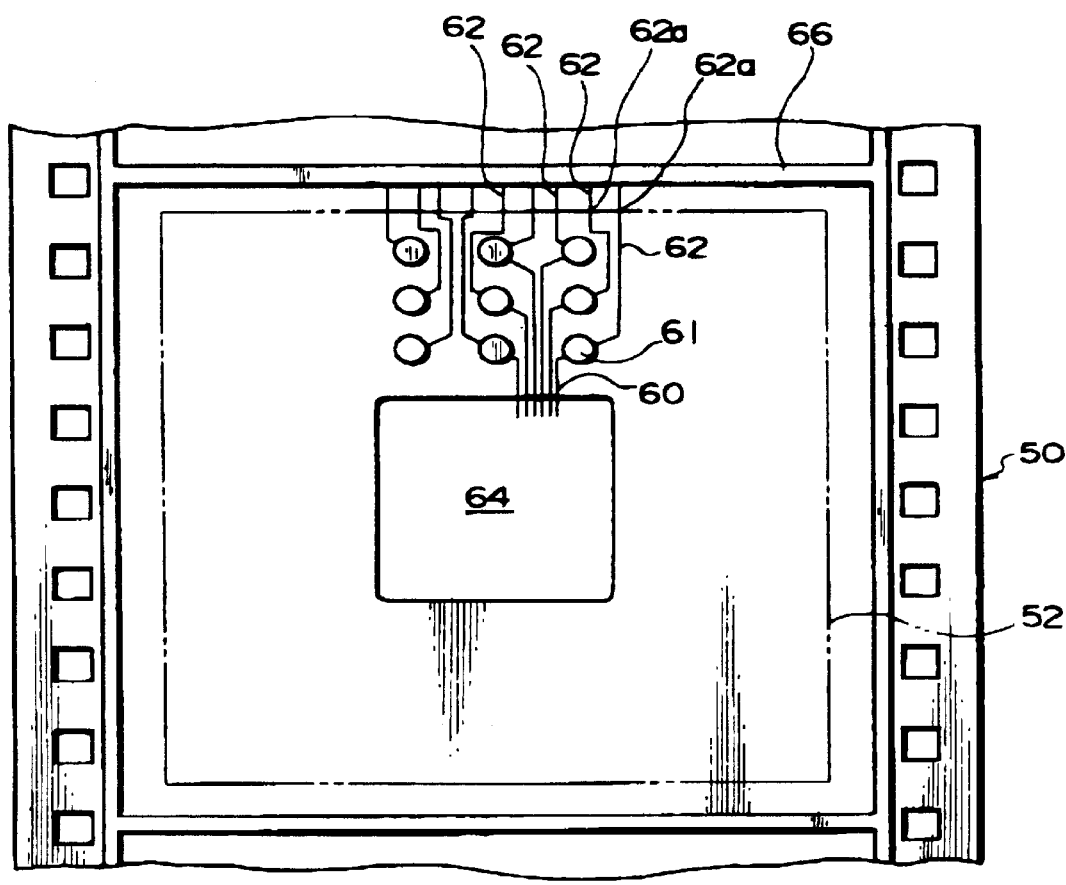
FIG. 3 is a diagram showing a film carrier tape according to the second embodiment.

FIG. 3 shows a film carrier tape according to a second embodiment of the present invention. On a film carrier tape 50 shown in this figure, device holes 64, leads 60 and 62, lands 61, and plating lead 66 are formed similarly to those on the film carrier tape 30 shown in FIG. 1, As compared with the film carrier tape 30 shown in FIG. 1, the film carrier tape SO shown in FIG. 3 differs in arrangement of leads 62 for connection between the lands 61 and the plating lead 66.

More specifically, as shown in FIG. 3, a plurality of leads 62 are arranged in a mutually dispersed fashion with equal spacing. Then, as in the conventional art, the film carrier tape 50 is punched out into a rectangular shape of an insulating film 52. Thus, adjacent leads 62 are equally spaced along a punched-out line on the film carrier tape 50.

In the present embodiment, since the film carrier tape 50 is punched out along a line where the plural leads 62 are equally spaced, end faces 62a of the leads 62 exposed on the outline edge of the insulating film 52 are equally spaced in mutually dispersed relationship. Thus, adjacent end faces 62a are spaced widely, thereby reducing an electric field due to a potential difference therebetween. Reduction of the electric field makes leakage unapt to occur even if impurities or foreign substances adhere to the outline edge of the insulating film 52, leading to improvement in the moisture resistance reliability.

Using the film carrier tape 50, a semiconductor device similar to the semiconductor device 10 shown in FIG. 2 (except the outline of the insulating film 12) can be fabricated through processes similar to those in the first embodiment (except the punched-out shape of the insulating film 12).

According to the present embodiment, since the film carrier tape 50 is punched out into a shape similar to that in the conventional art, a conventional model of semiconductor device fabrication apparatus may be used just by altering arrangement of the leads 62.

It is to be understood that the present invention is not limited in its application to the abovementioned embodiments, and many modifications and variations may be made therein. For example, the present invention is applicable to a front-TAB process in which the semiconductor chip 16 is mounted on the formation side of bumps 14 am well as aback-TAB process in which the semiconductor chip 16 is mounted on the side opposite to the formation side of bumps 14 as shown in FIG. 2, Further, a B-TAB type of insulating film having integrally formed bumps on the wiring side may be used instead of the insulating film 12. Still more, single-point bonding may be made using a film carrier tape having no bumps.

Figure 4:
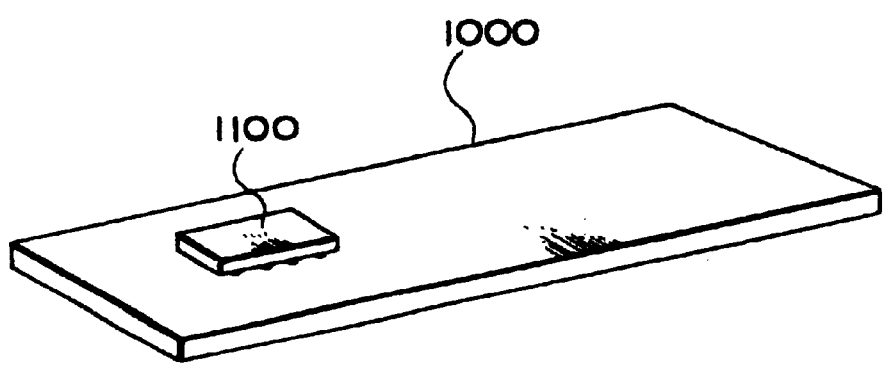
FIG. 4 is a diagram showing a circuit board in accordance with present invention.

Referring to FIG. 4, there is shown a circuit board 1000 on which a semiconductor device 1100 fabricated according to the present invention is mounted. It is common practice to use a circuit board made of organic resin material such as glass epoxy resin, for example. On the circuit board, wiring patterns made of copper or the like are printed to form desired circuits, and bumps of a semiconductor device are physically connected with these wiring patterns to provide electrical conductivity. If the semiconductor device is structured to absorb strain due to thermal expansion different from external thermal expansion, reliability of the semiconductor device on the circuit board can be ensured at the time of connection and thereafter Moreover, if wiring connections of the semiconductor device are arranged suitably, reliability at the time of connection and thereafter can also be improved. Still, a mounting area may be reduced down to that required for bare-chip mounting. Therefore, by using the circuit board, an electronic apparatus can be made compact in size. Still further, since more mounting space is available in terms of area, it is possible to incorporate more functions in a certain area.

Figure 5:
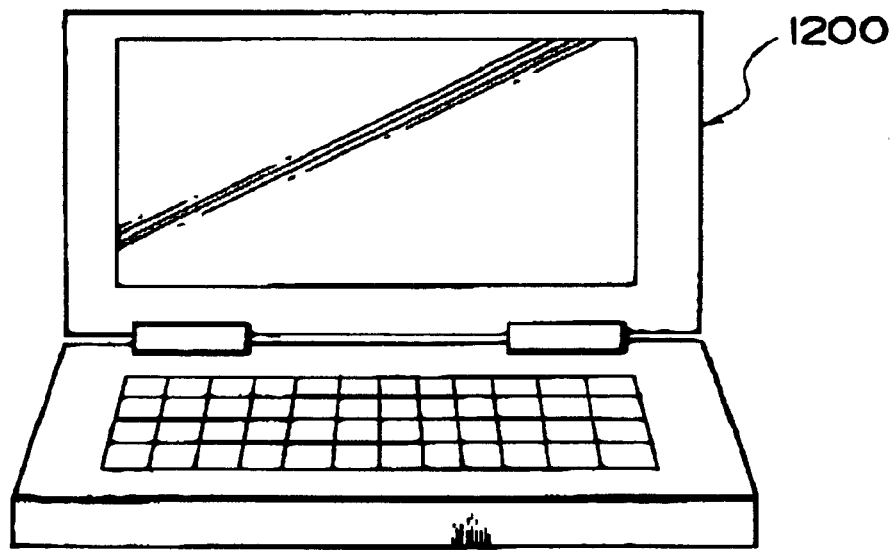
FIG. 5 is a diagram showing an electronic apparatus containing the circuit board on which the semiconductor device fabricated according to the method of the present invention is mounted.

In FIG. 5, as an example, there is shown a notebook-type personal computer 1200 containing the circuit board 1000.

In addition, by applying the present invention, it is also possible to fabricate surface-mounting-type electronic components (either active or passive parts) having a plurality of bumps as in semiconductor devices, for example, such electronic components as resistors, capacitors, coils, oscillators, filters, temperature sensors, thermistors, varistors, variable resistors, fuses, etc.

What is claimed is:

1. A semiconductor device comprising:

an insulating film having a device hole;

a plurality of lands formed on said insulating film;

a plurality of first leads having end faces exposed on an outline edge of said insulating film, each of said first leads being electroplated and connected with one of said lands, and said insulating film being outlined to have a cut in a region including each of said exposed end faces of said first leads;

a plurality of second leads having end portions protruding into said device hole, each of said second leads being electroplated and connected with one of said lands; and a semiconductor element connected with said end portions of said second leads in said device hole.

2. The semiconductor device as defined in claim 1, wherein said first leads are formed so that said exposed end faces are gathered at a plurality of points.

3. A circuit board on which is mounted a semiconductor device according to claim 2.

4. An electronic apparatus including a circuit board according to claim 3.

5. A semiconductor device comprising:

an insulating film having a device hole;

a plurality of lands formed on said insulating film;

a plurality of first leads having end faces exposed on an outline edge of said insulating film, each of said first leads being electroplated and connected with one of said lands, and said first leads being formed so that at least said exposed end faces are arranged in a mutually dispersed fashion;

a plurality of second leads having end portions protruding into said device hole, each of said second leads being electroplated and connected with one of said lands; and a semiconductor element connected with said end portions of said second leads in said device hole.

6. The semiconductor device as defined in claim 5, wherein said first leads are two-dimensionally arranged with equal spacing.

7. A circuit board on which is mounted a semiconductor device according to claim 6.

8. An electronic apparatus including a circuit board according to claim 7.

9. A circuit board on which is mounted a semiconductor device according to claim 5.

10. An electronic apparatus including a circuit board according to claim 9.

11. A film carrier tape comprising:

portions defining a plurality of device holes;

a plurality of lands; said lands are arranged in an area array, a plurality of leads having end portions protruding into said device holes, each of said leads running through one of said lands; and a plating lead connected with all of said leads said leads being electroplated via said plating lead and being formed to be arranged in a mutually dispersed fashion in a region between said lands and said plating lead.

12. The film carrier tape as defined in claim 11, wherein said leads are two-dimensionally arranged with equal spacing.

13. A circuit board on which is mounted a semiconductor device according to claim 1.

14. An electronic apparatus including a circuit board according to claim 13.

15. A method of making a semiconductor device, comprising:

providing a film carrier tape that includes portions defining a plurality of device holes, a plurality of lands, said lands being arranged in an area array, a plurality of leads having end portions protruding into said device holes, each of said leads running through one of said lands, and a plating lead connected with all of said leads, said leads being electroplated via said plating lead and being formed to be arranged in a mutually dispersed fashion in a region between said lands and said plating lead;

placing a semiconductor element in each of said device holes;

connecting the semiconductor element with said end portions of said leads; and stamping out a shape having a cut in a region in which said leads are formed from said film carrier tape.

16. The method of making a semiconductor device as defined in claim 15, wherein said leads are formed to gather a plurality of points.

* * * * *

UNITED STATES PATENT AND TRADEMARK OFFICE
CERTIFICATE OF CORRECTION

PATENT NO.     : 6,297,964 B1                                       Page 1 of 1
DATED          : October 2, 2001
INVENTOR(S)    : Nobuaki Hashimoto It is certified that error appears in the above-identified patent and that said Letters Patent is hereby corrected as shown below:

<u>Title page,</u>
Item [54], change "SEMICONDUCTOR DEVICE, METHOD OF FABRICATING THE SAME FILM CARRIER TAPE, CIRCUIT BOARD, AND ELECTRONIC APPARATUS"
to -- SEMICONDUCTOR DEVICE, METHOD OF FABRICATING THE SAME, FILM CARRIER TAPE, CIRCUIT BOARD, AND ELECTRONIC APPARATUS --.

Signed and Sealed this

Fifth Day of March, 2002

*Attest:*

*Attesting Officer*

JAMES E. ROGAN
*Director of the United States Patent and Trademark Office*